US005776807A

United States Patent [19]
Ronkainen et al.

[11] Patent Number: 5,776,807
[45] Date of Patent: Jul. 7, 1998

[54] METHOD FOR FABRICATING A TRIPLE WELL FOR BICMOS DEVICES

[75] Inventors: Hannu Ronkainen, Sovkantic, Finland; Gao Minghui, Singapore, Singapore

[73] Assignee: Tritech Microelectronics, Ltd., Singapore, Singapore

[21] Appl. No.: 910,270

[22] Filed: Aug. 13, 1997

[51] Int. Cl.[6] .................................... H01L 21/8238
[52] U.S. Cl. ..................... 438/202; 438/208; 438/234; 438/414
[58] Field of Search ................... 438/202, 203, 438/204, 205, 207, 208, 234, 414; 357/370

[56] References Cited

U.S. PATENT DOCUMENTS

| | | | |
|---|---|---|---|
| 4,435,896 | 3/1984 | Parrillo et al. | 29/571 |
| 5,104,829 | 4/1992 | Shida | 438/208 |
| 5,225,365 | 7/1993 | Cosentino | 437/57 |
| 5,338,696 | 8/1994 | Ilderem et al. | 437/34 |
| 5,374,586 | 12/1994 | Huang et al. | 438/452 |
| 5,393,677 | 2/1995 | Lien et al. | 438/234 |
| 5,455,189 | 10/1995 | Grobisich | 437/34 |
| 5,506,158 | 4/1996 | Eklund | 437/41 |

Primary Examiner—Tuan H. Nguyen
Attorney, Agent, or Firm—George O. Saile; Stephen B. Ackerman; William J. Stoffel

[57] ABSTRACT

To accomplish the above objectives, the present invention provides a method of fabricating a collector well in a semiconductor BiCMOS device. The method begins by providing a substrate having c-well areas, N-well areas, and P-well areas. The substrate has n-plug doped regions in said c-well areas. A stress release oxide layer is grown over the substrate surface. A first nitride layer 27 is formed over the stress release oxide layer 26. A C-well mask 29 having C-well mask openings 28A is formed over C-well areas 28 and openings are formed in the first nitride layer. Impurities are implanted through the opening forming collector-well regions. The c-well mask is then removed. A n-well photoresist mask having n-well mask openings 42A is formed over the first nitride layer and openings are etched in the first nitride layer over N-well areas 40. Ions impurities are implanted through the n-well nitride opening 42A forming n-well regions 44 in the n-well area in the substrate 10. The n-well mask 42 is then removed. A triple well oxide layer 45, 46 is formed over the n-well region 44, the c-well region and the n plug regions. The first nitride layer is then removed. Ion impurities into the substrate are implanted using the triple well oxide layer as a mask forming a p-well region and completing the triple well structure.

13 Claims, 7 Drawing Sheets

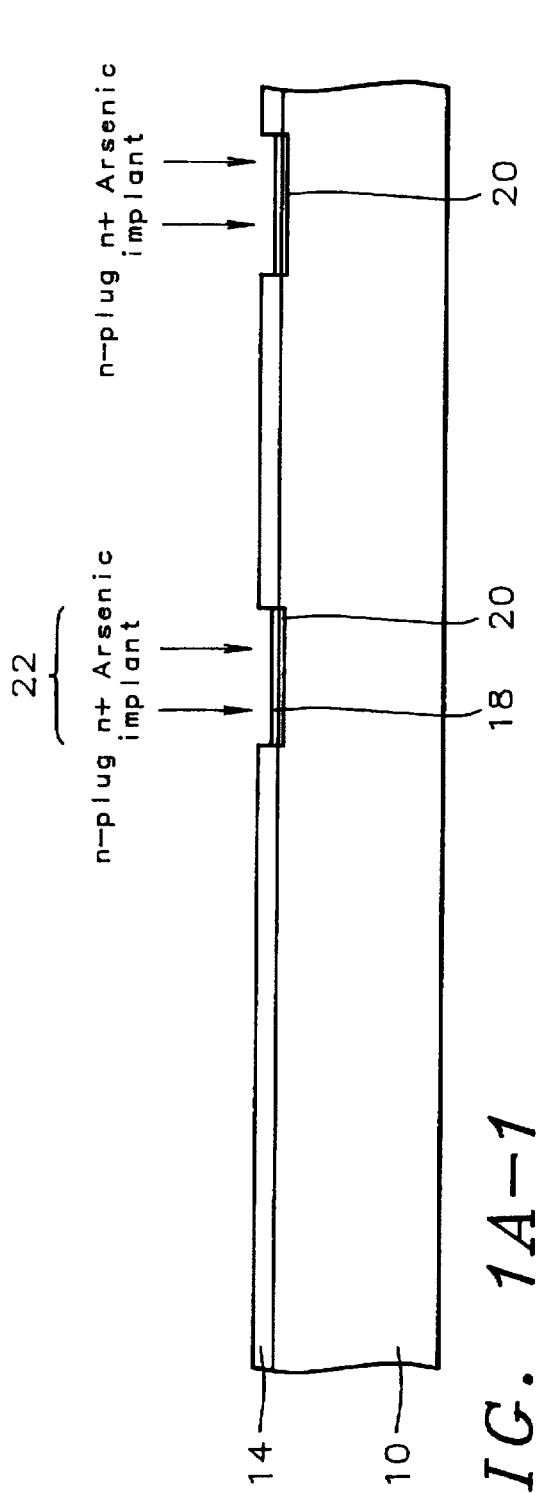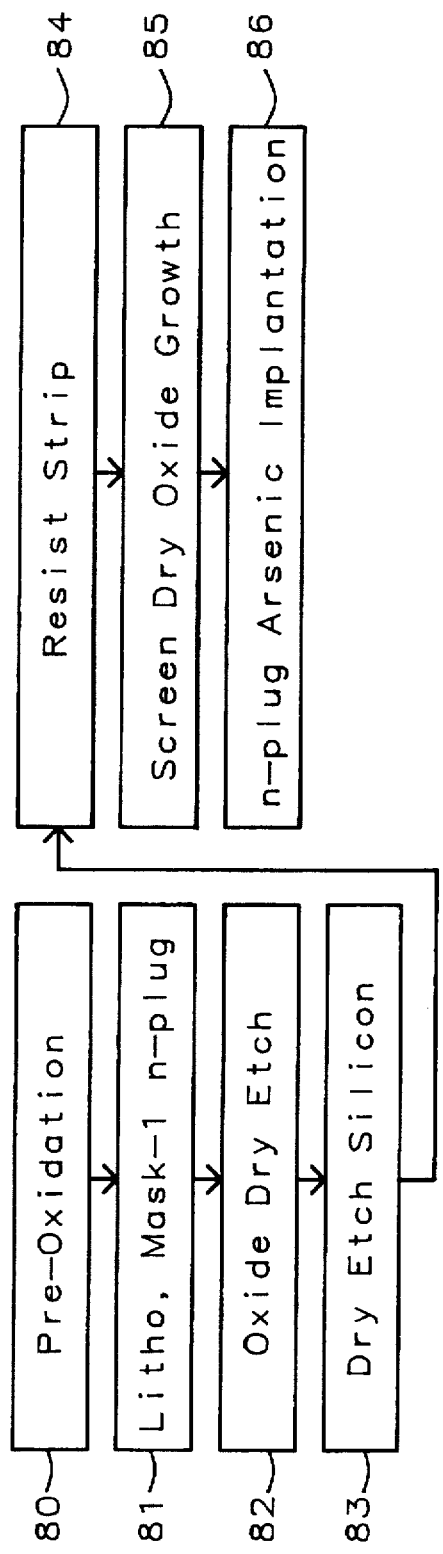

METHOD FOR FABRICATING A TRIPLE WELL FOR BICMOS DEVICES

BACKGROUND OF INVENTION

1) Field of the Invention

This invention relates generally to the fabrication of doped wells in a semiconductor device and more particularly to a method of forming a Triple well structure for a BiCMOS devices including Bipolar and CMOS devices.

2) Description of the Prior Art

In integrated circuits, transistors are typically isolated from each other, and selected transistor regions are interconnected by conductive lines to form a desired circuit. It is desirable to develop isolation and well techniques that would provide low leakage currents, high punchthrough voltages, low capacitances, a high yield, a small transistor size, a high transistor speed and low power consumption in bipolar and BiCMOS integrated circuits.

Bipolar and complimentary MOS (BiCMOS) devices are fabricated in a semiconductor structure which is comprised of a semiconductor substrate, having P-type and N-type buried layers form in the substrate. In the BICMOS device of the invention, no epitaxial layer is formed over the doped regions. Bipolar transistors are typically formed by using a moat region for the base of the bipolar transistor, doped polysilicon for the emitter and a well region (i.e., collector well) for the collector. Resistors are typically comprised of either a diffused regions or polysilicon which is doped n-type. BICMOS circuits present a particular challenge for fabrication because BiCMOS process are typically more complex than either bipolar or CMOS processes. In order to simplify BiCMOS processes, the same steps are sometimes used to fabricate both bipolar and MOS transistor features in the process. This, however, creates an interdependency between the bipolar and MOS transistor and makes it more difficult to optimize both the bipolar and MOS transistors. Thus, it is desirable to develop a simple and economical BiCMOS process that allows decoupling of the bipolar and MOS transistor characteristics.

One common structure in CMOS technology to optimize the performance of PMOS and NMOS transistors is the twin tub. In the twin tub, separate n-type tub regions (well) and p-type tub regions are formed in the substrate. The twin tub CMOS technology allows the impurity concentration in each well to be optimized independently of the other and provides lower source and drain capacitances than conventional CMOS technology. This customized well doping must be extended to BiCMOS devices to optimize both the CMOS transistors (PMOS and NMOS) and the bipolar transistors.

Moreover, there is a need to develop a low cost BiCMOS process having a separate bipolar collector well. The separate collector well is need to optimize high frequency properties of the bipolar transistor. To reduce fabrication costs of the bipolar transistors, existing CMOS fabrication steps should be utilized where possible.

SUMMARY OF THE INVENTION

It is an object of the present invention to provide a method of forming a collector well and a N-well for a BiCMOS devices using only one nitride layer which is patterned twice.

It is another objective of the present invention to provide a method of forming a triple well structure for a BiCMOS device using existing CMOS fabrication steps that is simpler and less expensive than conventional processes.

It is another objective of the present invention to fabricate a collector well having a deep profile and a lower collector resistance.

To accomplish the above objectives, the present invention provides a method of fabricating a collector well in a semiconductor BiCMOS device. The method begins by forming a first insulating (pre-oxidation) layer 10 composed of silicon oxide over a substrate 10 surface. A collector plug contact mask having openings for a collector plug contact areas is formed over the first insulating layer 14. The first insulating layer 14 is etched using the collector plug contact mask as a mask forming collector plug contact openings 22 in the first insulating layer 14 and exposing the substrate. The exposed substrate in the collector plug contact area is etched removing a first depth of the substrate. The collector plug contact mask is then removed. A screen oxide layer 18 is grown on the substrate in the collector plug contact areas 22. Impurity ions are implanted into the substrate through the collector plug contact openings 22 forming n-plug doped regions 24. The screen oxide layer 18 and first insulating layer 14 are removed. A stress release oxide layer 26 is grown over the substrate surface. A first nitride layer 27 is formed over the stress release oxide layer 26. A C-well mask 29 having C-well mask openings 28A is formed over C-well areas 28 in the substrate.

The first nitride layer 27 is then etched through the c-well mask openings 28 thereby forming c-well nitride openings in the first nitride layer exposing the n-plug regions. Impurities are implanted in the substrate 10 through the c-well opening forming collector well (c-well) regions. The c-well mask is then removed. The c-well regions 32 are annealed. A n-well mask 42 having n-well mask openings 42A is formed over the first nitride layer and the c-well regions. The first nitride layer 27 is etched using the n-well mask as an etch barrier mask forming n-well nitride openings 42A in the first nitride layer 27 over N-well areas 40. Impurity ions are implanted through the n-well nitride opening 42A forming n-well regions 44 in the n-well area 40 in the substrate 10. The n-well mask 42 is then removed. A (n-well/c-well oxide layer) Triple well oxide layer 45 46 is formed over the n-well region 44, the c-well region and the n plug regions. The first nitride layer is then removed. Impurity ions are implanted into the substrate using the n-well/c-well oxide layer as a mask forming a p-well region. The substrate is thermally annealed driving in the n-well regions, the p-wells regions and the c-well regions thus completing the triple well of the invention. PMOS, NMOS and bipolar transistors are formed over the triple wells completing the BiCMOS device.

The current invention provides a method of forming a collector well and a N-well for a BiCMOS devices using only one nitride layer which is patterned twice. The present invention provides a method of forming a triple well structure for a BiCMOS device using existing CMOS fabrication steps that is simpler and less expensive than conventional processes. The invention fabricates a collector well having a deep profile and a lower collector resistance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

3

FIGS. 1A-1, 2A-1, 2B-1 3A-1, 3B-1, and 4A-1 are a cross sectional views for illustrating the process for fabricating a triple well structure in a substrate.

FIGS. 1A-2, 2A-2, 2B-2, 3A-2, 3B-2, and 4A-2 are flow charts of the process steps shown in FIGS. 1A-1, 2A-1, 2B-1 3A-1, 3B-1, and 4A-1 for illustrating the process for fabricating a triple well structure in a substrate according to the present invention.

Figure 5:
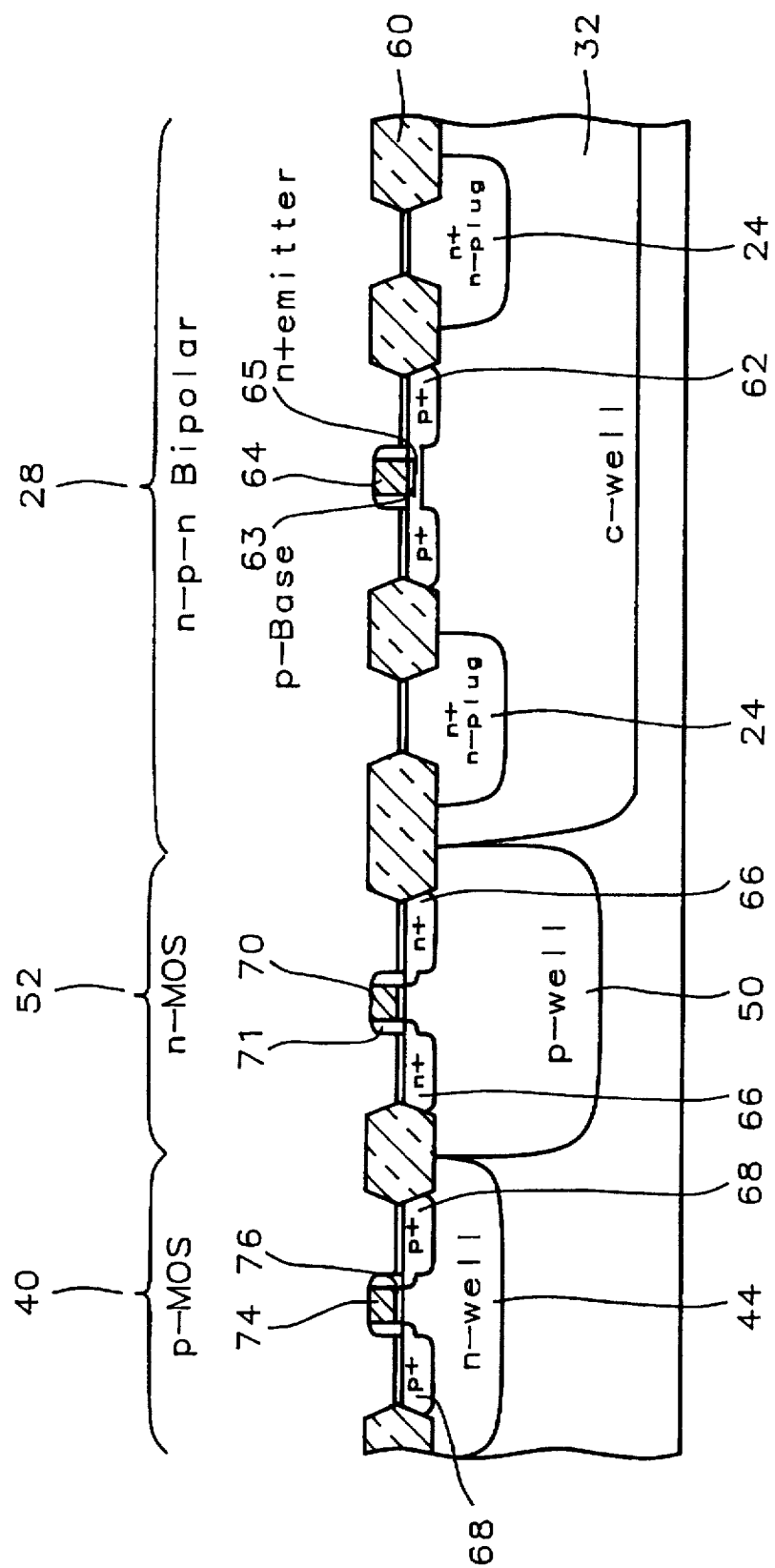

FIG. 5 is a cross sectional view for illustrating the process of forming BiCMOS devices using the triple well structure of the present invention.

DETAILED DESCRIPTION OF THE PREFERRED EMBODIMENTS

The present invention will be described in detail with reference to the accompanying drawings. The present invention provides a method of fabricating a triple well structure in a substrate. As shown in FIG. 5, The triple well comprises a p-well (for CMOS devices) 50 , a n-well (for CMOS devices) 44 and a collector well (i.e., c-well) (for Bipolar devices) 32. FIGS. 1A-1, 2A-1, 2B-1 3A-1, 3B-1, and 4A-1 are cross sectional views for illustrating the process for fabricating a triple well structure in a substrate. FIGS. 1A-2, 2A-2, 2B-2, 3A-2, 3B-2, and 4A-2 are flow charts showing a summary of the process steps shown in FIGS. 1A-1, 2A-1, 2B-1 3A-1, 3B-1, and 4A-1.

Figures 1, 2A:
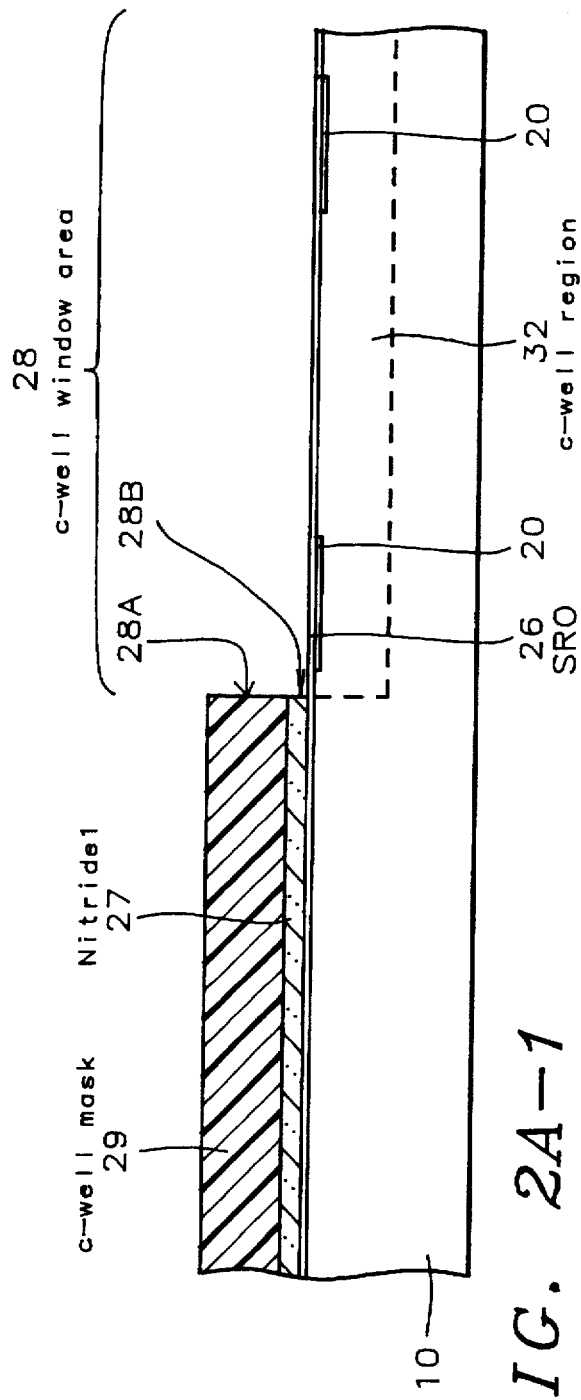
Figures 2, 2A:
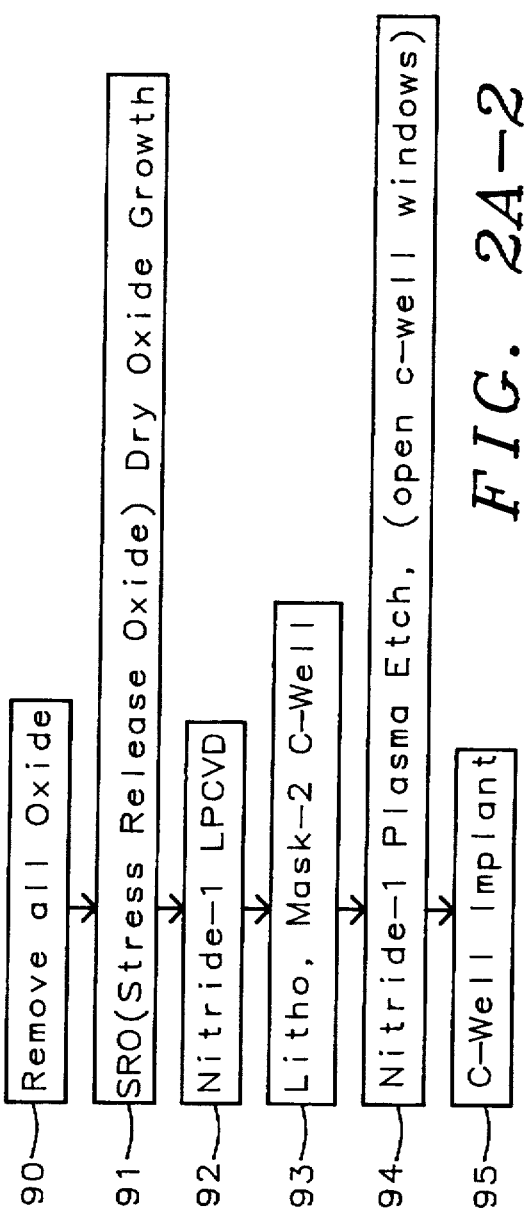

As shown in FIG. 1A-1, a first insulating (e.g., pre-oxidation layer) layer 14 composed of silicon oxide is formed over a substrate 10 surface. The substrate 10 is a semiconductor substrate preferably with a (100) crystalline orientation and a resistivity of about 6 to 20 Ohm-cm and preferably has a p-type doping. In general, the term "substrate surface" is meant to include the upper most exposed layers over the semiconductor wafer, such as a silicon surface, insulating layers and conductive lines. The substrate surface can be formed by processes and layers formed over a wafer.

The first insulating (pre-oxidation) layer 10 is preferably formed by a thermal oxidation and preferably has a thickness in a range of between about 300 and 320 nm and more preferably a thickness of about 310 nm.

A collector plug contact mask (not shown), having openings for collector plug contact areas 22, is formed over the first insulating (pre-oxidation) layer 14. Preferably positive photoresist is used. This mask is preferably used for opening windows for (arsenic high doped) collector-plug contact areas 22 for reduced collector series resistance.

The first insulating (pre-oxidation) layer 14 is etched using the collector plug contact mask as an etch barrier (e.g., mask) forming collector plug contact openings in the first insulating (pre-oxidation) layer 14 and exposing the substrate 10. Preferably the etch removes a thickness of said first insulating (pre-oxidation) layer in a range of about 100 and 140 nm and more preferably about 120 nm. Preferably, the substrate is also etched so that an alignment pattern is formed for subsequent layers. The depth of the substrate etch is dependent on processing equipment and must be optimized depending on the fabrication processes used.

The exposed substrate 10 in the collector plug areas 22 is preferably etched removing a first depth of substrate. The first depth is preferably in a range of between about 110 and 130 nm and more preferably about 120 nm.

Next, the collector plug contact mask is removed.

A screen oxide layer 18 is then grown on the substrate in the collector plug contact area 22. The screen oxide layer 18 is preferably grown using a dry thermal oxide process at a temperature in a range of about 890° and 910° C. and more preferably of about 900° C. and preferably has a thickness in a range of about 18 and 22 nm and more preferably of about 20 nm.

Figures 1, 2, 2B:
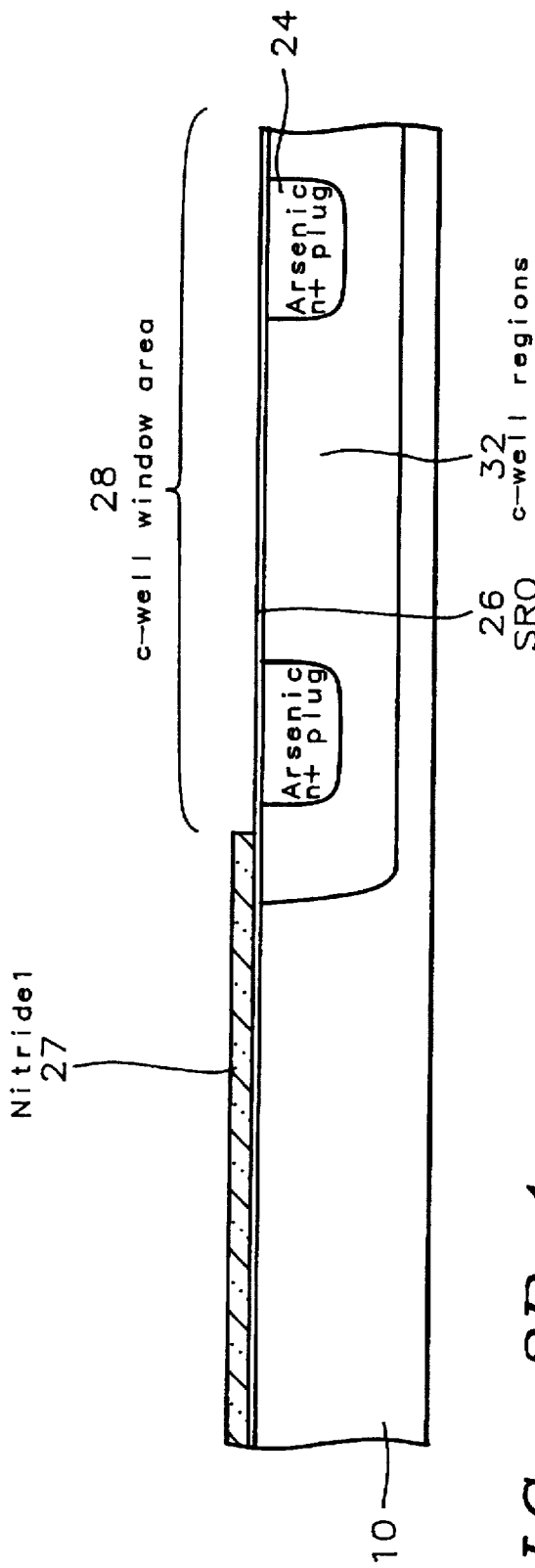

Subsequently impurity ions are implanted into the substrate through the collector plug contact opening 22 forming (un-annealed) n-plug doped regions 20. The n-plug doped regions 20 are later annealed to form n-plug doped regions 22 as shown in FIG. 2B-1. The impurity ions are preferably arsenic ions and the implant preferably has a dose in a range of about 5E14 and 5E15 atoms/cm$^2$ and more preferably about 1E15 atoms/cm$^2$, and an energy in a range of about 140 and 160 Kev and more preferably about 150 Kev.

As shown in FIG. 2A-1, the screen oxide layer 18 and first insulating (pre-oxidation) layer 14 are then removed thereby exposing the substrate 10 surface.

A stress release oxide (SRO) layer 26 is grown over the substrate surface. The stress release oxide layer 26 is preferably grown in a dry oxidation process at a temperature in a range of about 880° and 920° C. and more preferably about 900° C., and for a time in a range of about 60 and 90 minutes and more preferably about 70 minutes. The time range depends on the temperature. The stress release oxide layer 26 preferably has a thickness in a range of between about 25 and 35 nm and more preferably about 30 nm. The layer 26 reduces the stress between the substrate and the subsequently formed first silicon nitride layer 27.

A first nitride layer 27 is formed over the stress release oxide layer 26. The first nitride layer is preferably formed using an LPCVD process. The silicon nitride layer 27 can be formed by reacting silane and ammonia at atmospheric pressure and a temperature of between about 700° and 900° C., or by reacting dichlorosilane and ammonia at reduced pressure at approximately 700° C. Also, silicon nitride can be formed by plasma enhance chemical vapor deposition (PECVD) by reacting silane with ammonia or nitrogen in a glow discharge between 200° and 350° C. The silicon nitride layer preferably has a thickness in a range of about 130 and 170 nm and more preferably about 150 nm. The preferred first nitride process is the LPCVD process at about 750° C.

As shown in FIG. 2A-1, a collector well (i.e.. C-well) photoresist mask 29 having C-well mask openings 28A is formed over C-well areas 28 in the substrate 10.

Next, the first nitride layer 27 is etched through the c-well photoresist mask openings 28A forming c-well nitride openings 28B in the first nitride layer 27 exposing the n-plug regions 22. The etch is preferably a plasma etch selective to silicon nitride, such as a $CH_4+O_2$ plasma etch.

Impurity ions are then implanted in the substrate 10 through the c-well opening forming doped c-well regions 32. The implant is preferably performed using n-type phosphorous impurity ions at a dosage in a range of about 1E13 and 1 E14 atoms/cm$^2$ and more preferably about 3E13 atoms/cm$^2$ and preferably at a power in a range of about 130 and 170 Kev and more preferably at about 150 Kev.

As shown in FIG. 2B-1, the c-well mask 29 is removed.

Still referring to FIG. 2B-1, the substrate including the c-well regions 32 and N-plug doped regions 24 are then annealed. The anneal/drive in is preferably performed at a temperature in a range of about 1165° and 1185° C. and more preferably about 1175° C. for a time in a range of about 180 and 240 minutes and more preferably about 200 minutes. After the drive in, the c-well regions 32 preferably have a depth from the substrate surface (xj) in a range of about 4.5 and 5.5 pm and more preferably between about 4.5 and 5.0

μm and more preferably about depth about 5.0 μm. This process (separate c-well drive in) is preferred when it is desirable to make the collector deeper than the n-well.

Alternately, the C-Well drive in can be performed later in the process, simultaneously with a n-Well/P-well drive in. Depending on the transistor design, this simultaneous C-well/N-well/p-well drive-in could be the preferred process.

Also, the n-plug doped regions 24 preferably have an depth in a range of about 3.0 and 5.0 μn and more preferably about 4.0 μm.

Figures 1, 3A:
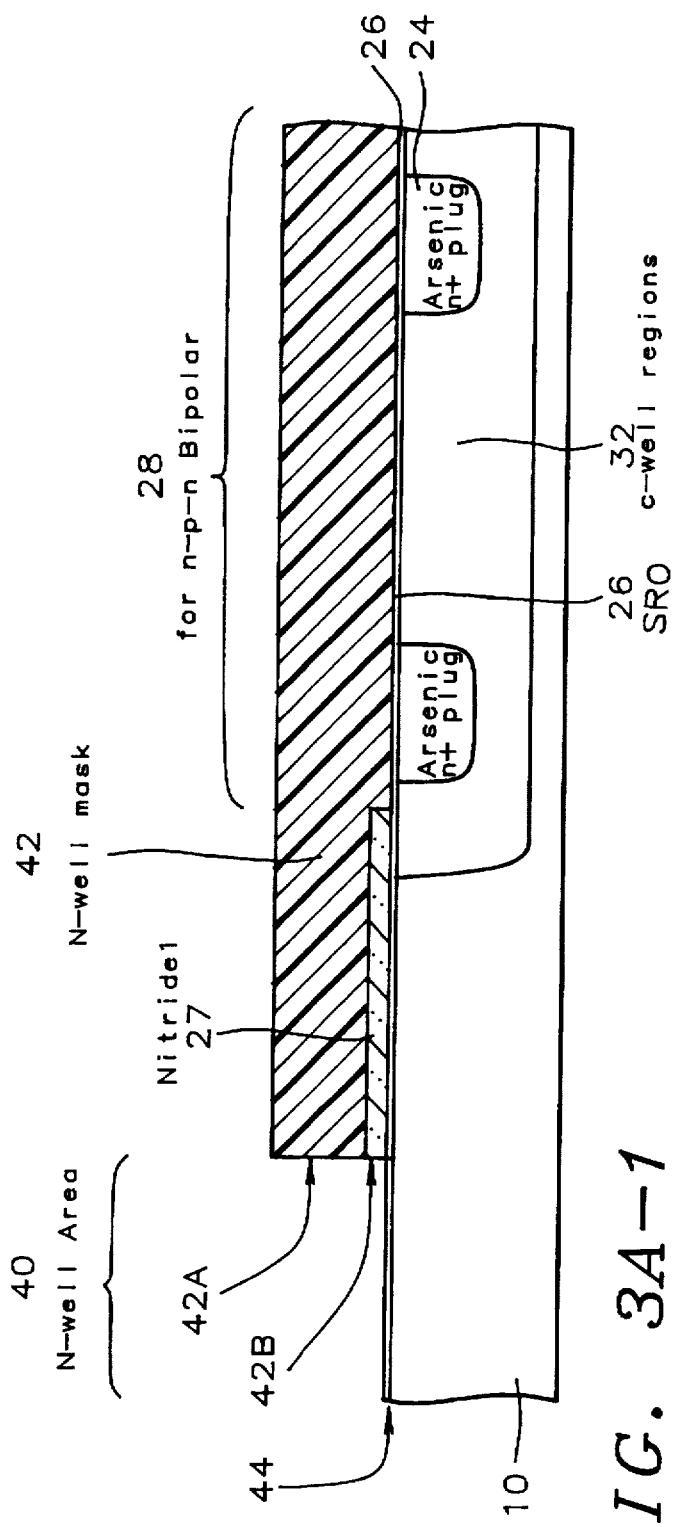
Figures 2, 3A:
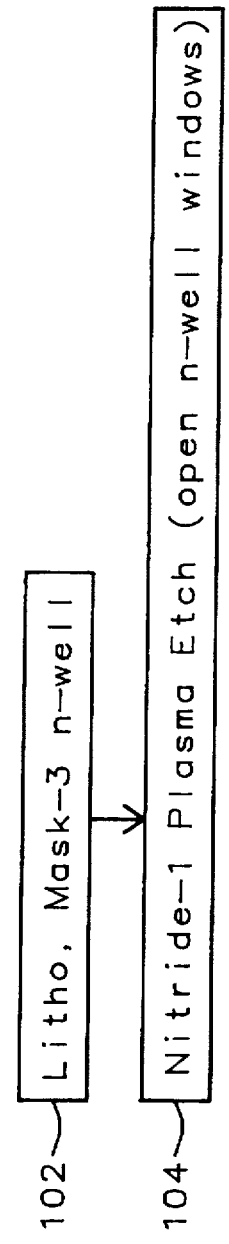

As shown in FIG. 3A-1, a n-well mask 42 is formed over the first nitride layer 27 (e.g., p-well region) and over the c-well regions 32. The n-well mask 42 has n-well mask opening 42A that expose the n-well regions 40 (See FIG. 5).

The first nitride layer 27 is etched using the n-well mask 42 as an etch barrier mask forming n-well nitride openings 42B in the first nitride layer 27 over N-well areas 40. The etch is preferably a plasma etch with a selectivity to silicon nitride.

Figures 1, 2, 3B:
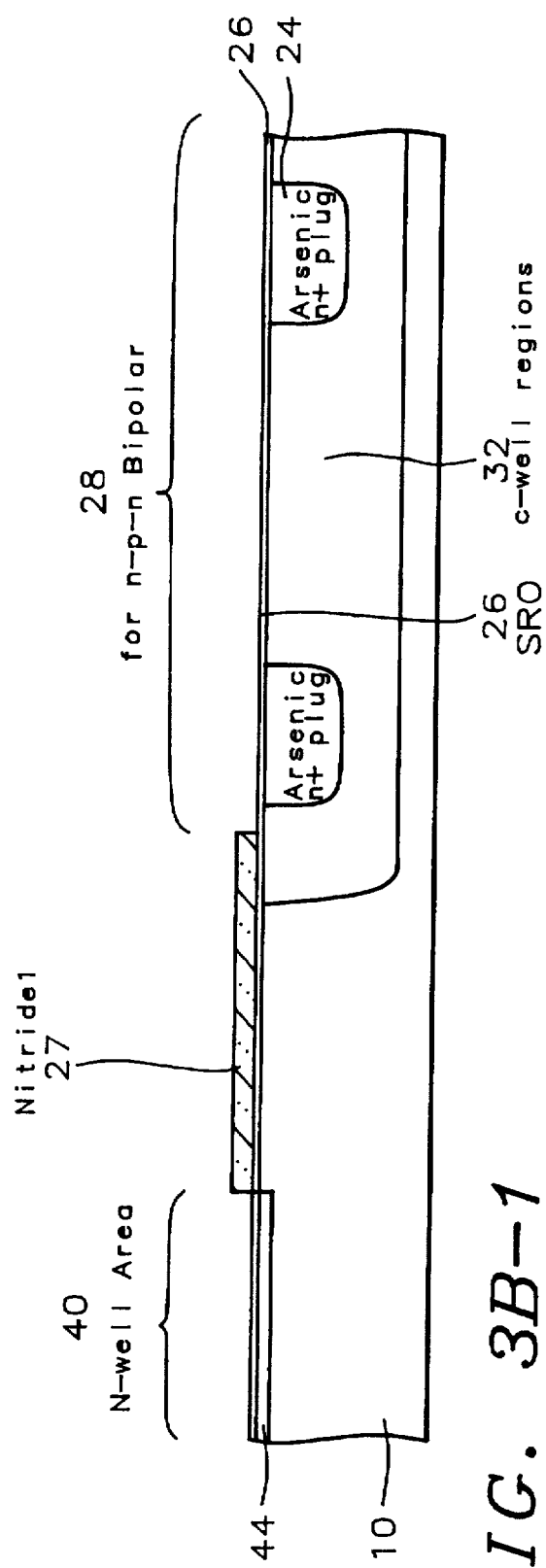

As shown in FIG. 3B-1, impurities are implanted through the n-well nitride openings 42B forming (un-annealed) n-well regions 44 in the n-well area 40 in the substrate 10. The implant is preferably performed using phosphorous impurities ions at a dosage in a range of about 1E12 and 5E 13 atoms/cm$^2$ and more preferably about 8E12 atoms/cm$^2$ and preferably at a power in a range of about 130 and 170 Kev and more preferably at about 150 Kev.

As shown in FIG. 3B-1, the n-well mask 42 is then removed.

Figures 1, 4A:
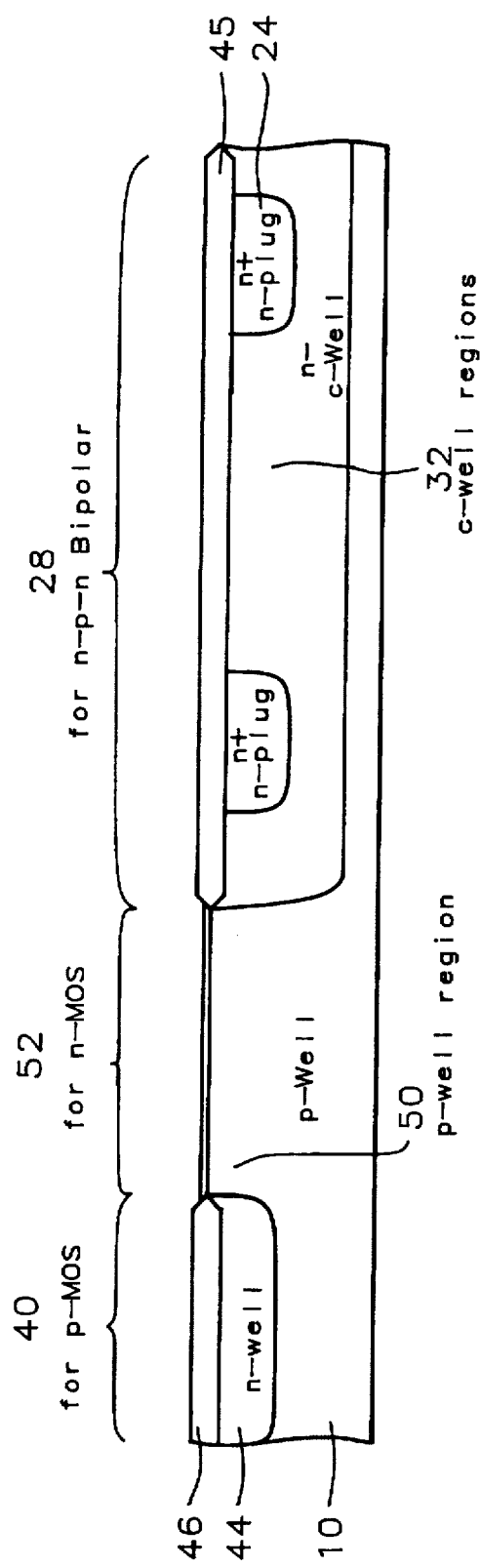
Figures 2, 4A:
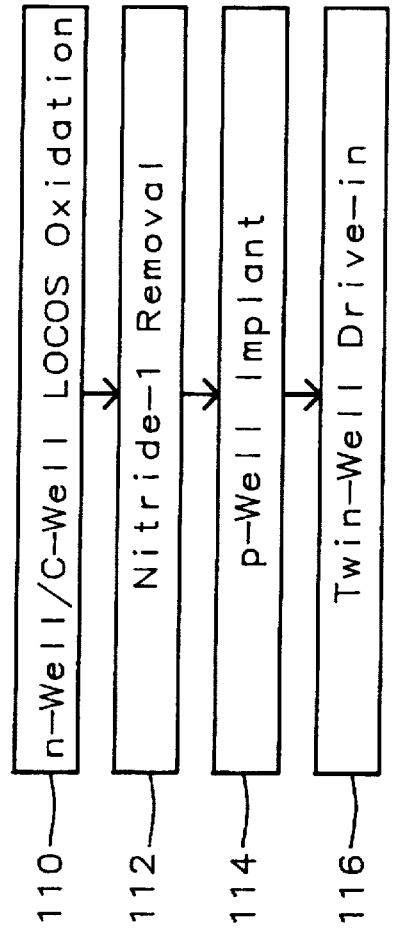

Turning to FIG. 4A-1, a triple well oxide layer (e.g., n-well/c-well LOCOS oxide layer 45 46) is formed over the n-well region 44, the c-well regions 28 and the n plug regions 24. The oxide is preferably form using a dry oxide process and preferably has a thickness in a range of between about 350 and 410 nm and more preferably of about 380 nm. The first nitride layer 27 will serve as a LOCOS mask layer to protect the p-well and prevent oxidation of the p-well area 52. This oxidation/heat treatment is preferably performed at a temp in a range of about 1000° and 1100° C. for a time in a range of about 30 and 60 minutes. This oxidation/heat treatment drives in the c-well 32 lowering the collector resistance. This lower collector sheet resistance increases the high speed bipolar transistor performance. The collector sheet resistance is preferably in a range of about 1000 and 3000 ohm/square.

The first nitride layer is then removed using an etch selective to silicon nitride such as a H$_3$PO$_4$ etch at about 170° C. for about 60 minutes.

Next, impurity ions are implanted into the substrate using the n-well/c-well oxide layers 45 46 as a mask forming a p-well region 50. The implant is preferably performed using B11 at a dose in a range of about 5E11 and 1E13 atoms/cm$^2$ and more preferably about 4E12 atoms/cm$^2$ and preferably at a power in a range of about 40 and 60 Kev and more preferably about 50 keV.

Next, a triple well drive in is performed. The substrate is thermally annealed driving in the n-well regions 44, the p-wells regions 50 and the c-well regions 32. The drive in is preferably performed a temperature in a range of about 1100° and 1200° C. and more preferably about 1150° C. for a time in a range of about 200 and 400 minutes and more preferably about 300 minutes. The exact conditions depend on the CMOS part of the process and are usually fixed beforehand.

As shown in FIG. 5, NMOS, PMOS and Bipolar transistors are formed using conventional processes over the triple well structure of the present invention.

FIG. 5 illustrates, in cross section, a bipolar transistor 63 64 24, a PMOS transistor 68 74 68 , and a NMOS transistor 55 70 66 50. The structure is formed into a substrate 10 which, in the embodiment is preferably p-type silicon. Buried N+ regions 24 in bipolar transistor 63 64 24 (formed over the c-well 28) serves a sub-collector, in the convention manner, with N+ region 24 providing a surface contact thereto. N region 32 serves as the collector region in bipolar transistor 63 64 65 24. Intrinsic base 65 is a p-type region disposed within n-region 32. P+ regions 62 serves as extrinsic base region of bipolar transistor 63 64 65 24. Emitter electrode 63 may be a doped polysilicon layer which extends through an opening in an insulating layer to intrinsic base regions 62 63.

N well region 44 is the well region for the p-channel transistor 68 74 68. P-regions 68 serve as source and drain regions for the PMOS transistor. The gate electrode 74 is formed over a gate oxide layer 76. The NMOS transistor 66 70 66 50 is formed in the P-well 50. Sidewall spacers are formed on the sidewalls of the gate electrodes 74 70 64. The n-doped regions 66 serve as source and drain regions separated by the gate electrode 70. Field insulating regions 70 separate base regions 62 from collector contacts 24. NMOS transistors 66 70 66 50 and PMOS transistors 68 74 68.

The current invention provides a method of forming a collector well and a N-well for a BiCMOS devices using only one nitride layer 27 which is patterned twice. The use of only one nitride layer 27 reduces costs and simplifies the process. Using one nitride layer reduces the number of processing steps and the identical method can be used on both n-well and c-well formation resulting in better utilization of process equipment.

The present invention provides a method of forming a triple well structure for a BiCMOS device using existing CMOS fabrication steps that is simpler and less expensive than conventional processes. The invention fabricates a collector well having a deep profile and a lower collector resistance.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a collector well in a semiconductor device comprising:

a) providing a substrate having c-well areas, N-well areas, and P-well areas, said substrate having n-plug doped regions in said c-well areas, b) growing a stress release oxide layer over said substrate, c) forming a first nitride layer over said stress release oxide layer, d) forming a C-well mask having C-well mask openings over C-well areas in said substrate, e) etching said first nitride layer through said c-well mask openings forming c-well nitride openings in said first nitride layer thereby exposing said n-plug regions, f) implanting impurities in said substrate through said c-well nitride openings forming c-well regions, g) removing said c-well mask, h) annealing said c-well regions, i) forming a n-well mask over said first nitride layer and said c-well regions, said n-well mask having n-well mask openings over said n-well areas;

j) etching said first nitride layer using said n-well mask as a mask forming n-well nitride openings in said first nitride layer over N-well areas, k) implanting impurities through said n-well nitride openings forming n-well regions in said n-well area in said substrate, and l) removing said n-well mask.

2. The method of claim 1 which further includes:

a) forming a triple well oxide layer over said n-well regions, said c-well regions and said n plug regions, b) removing said first nitride layer, c) implanting impurities into said substrate using said triple well oxide layer as a mask forming a p-well regions, annealing said substrate driving in said n-well regions, said p-well regions and said c-well regions.

3. The method of claim 1 wherein said n-plug doped regions have an depth in a range of about 4.0 and 6.0 µm.

4. The method of claim 1 wherein said first nitride layer has a thickness in a range of between about 130 and 170 nm.

5. The method of claim 1 wherein said c-well regions are annealed at a temperature in a range of about 1165° and 1185° C., for a time in a range of about 180 and 240 minutes and after said anneal said c-well regions have a depth from the substrate surface in a range of about 4.5 and 5.0 µm.

6. The method of claim 1 wherein the c-well regions have a collector sheet resistance in a range of between about 1000 and 3000 ohm/square.

7. A method of fabricating a triple well structure in a semiconductor device comprising:

a) forming a first insulating layer composed of silicon oxide over a substrate surface, b) forming a collector plug contact mask having openings for a collector plug contact areas over said first insulating layer, c) etching said first insulating layer using said collector plug contact mask as a mask forming collector plug contact openings in said first insulating layer and exposing said substrate, d) etching said exposed substrate in said collector plug contact area removing a first depth of said substrate, said first depth in a range of about 110 and 130 nm, e) removing said collector plug contact mask, f) growing a screen oxide layer on said substrate in said collector plug contact areas, g) implanting ions into said substrate through said collector plug contact openings forming n-plug doped regions, h) removing said screen oxide layer and first insulating layer exposing the substrate surface, i) growing a stress release oxide layer over said substrate surface, j) forming a first nitride layer over said stress release oxide layer, k) forming a C-well mask having C-well mask openings over C-well areas in said substrate, l) etching said first nitride layer through said c-well mask openings for forming c-well nitride openings in said first nitride layer and exposing said n-plug regions, m) implanting impurities in said substrate through said c-well nitride openings forming c-well regions, n) removing said c-well mask, o) annealing said c-well regions, p) forming a n-well mask over said first nitride layer and said c-well regions, said n-well mask having n-well mask openings over said n-well areas;

q) etching said first nitride layer using said n-well mask as a mask forming n-well nitride openings in said first nitride layer over N-well areas.

r) implanting impurities through said n-well nitride openings forming n-well regions in said n-well area in said substrate, s) removing said n-well mask, t) forming a triple well oxide layer over said n-well regions, said c-well regions and said n plug regions, u) removing said first nitride layer,implanting impurities into said substrate using said triple well oxide layer as a mask forming a p-well region, w) Annealing said substrate driving in said n-well regions, said p-wells regions and said c-well regions.

8. The method of claim 7 wherein said n-plug doped regions have an depth in a range of about 4.0 and 6.0 µm.

9. The method of claim 7 wherein said first nitride layer has a thickness in a range of between about 130 and 170 nm.

10. The method of claim 7 wherein said c-well regions are annealed at a temperature in a range of about 1165° and 1185° C., for a time in a range of about 180 and 240 minutes and after said anneal said c-well has a depth from the substrate surface in a range of about 4.5 and 5.0 µm.

11. The method of claim 7 wherein said c-well regions has a collector sheet resistance in a range of between about 1000 and 3000 ohm/square.

12. A method of fabricating a triple well structure in a semiconductor device comprising:

a) forming a first insulating layer composed of silicon oxide over a substrate surface, b) forming a collector plug contact mask having openings for a collector plug contact areas over said first insulating layer, c) etching said first insulating layer using said collector plug contact mask as a mask forming collector plug contact openings in said first insulating layer and exposing said substrate, d) etching said exposed substrate in said collector plug contact area removing a first depth of said substrate, said first depth in a range of about 110 and 130 nm, e) removing said collector plug contact mask, f) growing a screen oxide layer on said substrate in said collector plug contact areas, g) implanting ions into said substrate through said collector plug contact openings forming n-plug doped regions, h) removing said screen oxide layer and first insulating layer exposing the substrate surface, i) growing a stress release oxide layer over said substrate surface, j) forming a first nitride layer over said stress release oxide layer, said first nitride layer has a thickness in a range of between about 130 and 170 nm;

k) forming a C-well mask having C-well mask openings over C-well areas in said substrate, l) etching said first nitride layer through said c-well mask openings for forming c-well nitride openings in said first nitride layer and exposing said n-plug regions, m) implanting impurities in said substrate through said c-well nitride openings forming c-well regions, n) removing said c-well mask.
o) annealing said c-well regions.
p) forming a n-well mask over said first nitride layer and said c-well regions, said n-well mask having n-well mask openings over said n-well areas;
q) etching said first nitride layer using said n-well mask as a mask forming n-well nitride openings in said first nitride layer over N-well areas.
r) implanting impurities through said n-well nitride openings forming n-well regions in said n-well area in said substrate,
s) removing said n-well mask.
t) forming a triple well oxide layer over said n-well regions, said c-well regions and said n plug regions.
u) removing said first nitride layer,implanting impurities into said substrate using said triple well oxide layer as a mask forming a p-well region.
w) annealing said substrate driving in said n-well regions, said p-wells regions and said c-well regions; thereby said n-plug doped regions have an depth in a range of about 4.0 and 6.0 μm; said anneal said c-well regions have a depth from the substrate surface in a range of about 4.5 and 5.0 μm; said c-well regions have a collector sheet resistance in a range of between about 1000 and 3000 ohm/square.

13. The method of claim 12 wherein said c-well regions are annealed at a temperature in a range of about 1165° and 1185° C., for a time in a range of about 180 and 240 minutes.

* * * * *